(12) United States Patent
Hira et al.

(10) Patent No.: US 9,876,484 B2
(45) Date of Patent: Jan. 23, 2018

(54) ELASTIC WAVE DEVICE WITH FIRST AND SECOND SUPPORT LAYERS PROVIDING A HOLLOW PATH

(71) Applicant: Murata Manufacturing Co., Ltd., Nagaokakyo-shi, Kyoto-fu (JP)

(72) Inventors: Mitsuyoshi Hira, Nagaokakyo (JP); Seiji Kai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 62 days.

(21) Appl. No.: 15/011,864

(22) Filed: Feb. 1, 2016

(65) Prior Publication Data

US 2016/0149557 A1    May 26, 2016

Related U.S. Application Data

(63) Continuation of application No. PCT/JP2014/069905, filed on Jul. 29, 2014.

(30) Foreign Application Priority Data

Aug. 13, 2013  (JP) ................ 2013-168080

(51) Int. Cl.
*H03H 9/72*  (2006.01)
*H03H 9/64*  (2006.01)
(Continued)

(52) U.S. Cl.
CPC .......... *H03H 9/725* (2013.01); *H03H 9/1092* (2013.01); *H03H 9/64* (2013.01);
(Continued)

(58) Field of Classification Search
CPC .. H03H 9/0057; H03H 9/1042; H03H 9/1064; H03H 9/1071; H03H 9/1092;
(Continued)

(56) References Cited

U.S. PATENT DOCUMENTS

| | | | |
|---|---|---|---|
| 7,528,523 B2 * | 5/2009 | Aoki | H03H 3/08 310/313 R |
| 2001/0033120 A1 | 10/2001 | Kobayashi et al. | |

(Continued)

FOREIGN PATENT DOCUMENTS

| | | | | |
|---|---|---|---|---|
| JP | 2003-283289 A | 10/2003 | | |
| JP | 2007-081613 A | * 3/2007 | ........... | H03H 9/1092 |

(Continued)

OTHER PUBLICATIONS

Official Communication issued in International Patent Application No. PCT/JP2014/069905, dated Oct. 28, 2014.

*Primary Examiner* — Barbara Summons
(74) *Attorney, Agent, or Firm* — Keating & Bennett, LLP

(57) ABSTRACT

In an elastic wave device, a plurality of elastic wave elements that include IDT electrodes are provided on a piezoelectric substrate, and a support layer that surrounds the elastic wave elements is provided on the piezoelectric substrate to define hollow portions in which the elastic wave elements are located. A cover member is stacked on the support layer, so that the hollow portions, in which the elastic wave elements are located, are provided, and the support layer includes a first support layer and a second support layer. The first support layer extends along an outer peripheral edge of the piezoelectric substrate, and the second support layer is located in a region surrounded by the first support layer and disposed around the elastic wave elements so as to have the hollow portions, in which the elastic wave elements are located. A hollow path is provided between the first support layer and the second support layer and arranged to allow communication between at least two of the hollow portions.

16 Claims, 5 Drawing Sheets

(51) Int. Cl.
*H03H 9/10* (2006.01)
*H03H 9/00* (2006.01)

(52) U.S. Cl.
CPC ......... *H03H 9/0057* (2013.01); *H03H 9/1042* (2013.01); *H03H 9/1071* (2013.01)

(58) Field of Classification Search
CPC ...... H03H 9/64; H03H 9/725; H03H 9/02897; H03H 9/02984
USPC ...... 333/133, 193; 310/313 R, 313 B, 313 D
See application file for complete search history.

(56) References Cited

U.S. PATENT DOCUMENTS

| | | | |
|---|---|---|---|
| 2002/0101304 A1* | 8/2002 | Onishi | H03H 9/02559 333/193 |
| 2006/0192462 A1 | 8/2006 | Iwamoto et al. | |
| 2010/0237963 A1 | 9/2010 | Takamine | |
| 2010/0327694 A1 | 12/2010 | Omote et al. | |

FOREIGN PATENT DOCUMENTS

| | | |
|---|---|---|
| JP | 2008-235432 A | 10/2008 |
| JP | 2010-278972 A | 12/2010 |
| KR | 10-2001-0081032 A | 8/2001 |
| KR | 10-2006-0095958 A | 9/2006 |
| WO | 2006/006343 A1 | 1/2006 |
| WO | 2009/075088 A1 | 6/2009 |
| WO | 2009/116222 A1 | 9/2009 |

* cited by examiner

COMPARATIVE EXAMPLE

US 9,876,484 B2

ELASTIC WAVE DEVICE WITH FIRST AND SECOND SUPPORT LAYERS PROVIDING A HOLLOW PATH

BACKGROUND OF THE INVENTION

1. Field of the Invention

The present invention relates to an elastic wave device that includes a piezoelectric substrate and a plurality of interdigital transducer (IDT) electrodes that are provided on the piezoelectric substrate. More specifically, the present invention relates to an elastic wave device that includes a plurality of IDT electrodes that are sealed with a support layer and a cover member.

2. Description of the Related Art

In the related art, various elastic wave devices that are called wafer-level packages (WLP) have been proposed. International Publication No. WO 2009/116222, which will be described below, discloses an example of this type of elastic wave device. A plurality of surface acoustic wave elements are formed on a single piezoelectric substrate. Each of the surface acoustic wave elements includes an IDT electrode in at least a portion of the surface acoustic wave element. In International Publication No. WO 2009/116222, in order to seal the surface acoustic wave elements, a support layer is formed on the piezoelectric substrate in such a manner as to surround the surface acoustic wave elements. A cover member is joined to the support layer. As a result, hollow portions in which the surface acoustic wave elements are present are formed.

In the elastic wave device described in the above-described International Publication No. WO 2009/116222, the cover member is stacked on and joined to the support layer. A void may sometimes be generated in a joint portion between the support layer and the cover member. Thus, the void may sometimes allow communication between the hollow portion and the outside, and as a result, the airtightness of the hollow portion may sometimes be reduced resulting in a leak defect.

SUMMARY OF THE INVENTION

Preferred embodiments of the present invention provide an elastic wave device in which leak defects are reduced or prevented.

An elastic wave device according to a preferred embodiment of the present invention includes a piezoelectric substrate, a plurality of elastic wave elements, a support layer, and a cover member. The plurality of elastic wave elements are provided on the piezoelectric substrate and each includes at least one IDT electrode. The support layer is disposed outside regions in which the elastic wave elements are located on the piezoelectric substrate to define hollow portions in portions in which the elastic wave elements are provided. The cover member seals the portions, in which the elastic wave elements are provided, and that is stacked on the support layer in order to form the hollow portions. In a preferred embodiment of the present invention, the support layer includes a first support layer that is disposed along an outer peripheral edge of the piezoelectric substrate and a second support layer that is disposed in a region surrounded by the first support layer. In the region surrounded by the first support layer, the second support layer surrounds the portions in which the elastic wave elements are located. In a preferred embodiment of the present invention, a hollow path is provided between the first support layer and the second support layer, and the hollow path enables communication between at least two of the hollow portions.

In the elastic wave device according to a preferred embodiment of the present invention, an opening is provided in the second support layer to reduce a planar area of the second support layer.

In the elastic wave device according to another preferred embodiment of the present invention, the first support layer has a closed-loop shape.

In the elastic wave device according to another preferred embodiment of the present invention, the plurality of hollow portions are sealed liquid-tight.

In an elastic wave device according to another preferred embodiment of the present invention, when seen in plan view, an outer peripheral edge of the cover member reaches the outer peripheral edge of the piezoelectric substrate, and a wafer-level package is provided.

In an elastic wave device according to a preferred embodiment of the present invention, since a support layer includes first and second support layers, and a hollow path is provided between the first support layer and the second support layer, the probability of a leak defect occurring due to generation of a void is effectively reduced. In other words, even if a void is generated in the second support layer, the void only enables communication between the hollow path and a hollow portion, and a leak defect between the outside and the hollow portion is less likely to occur. In addition, since the support layer is divided into the first support layer and the second support layer, the area of the second support layer is reduced, and generation of a void is less likely to occur or is prevented. Thus, a leak defect due to generation of a void is less likely to occur or is prevented. Therefore, the probability of a leak defect occurring due to generation of a void is effectively reduced or eliminated.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

Figure 1:
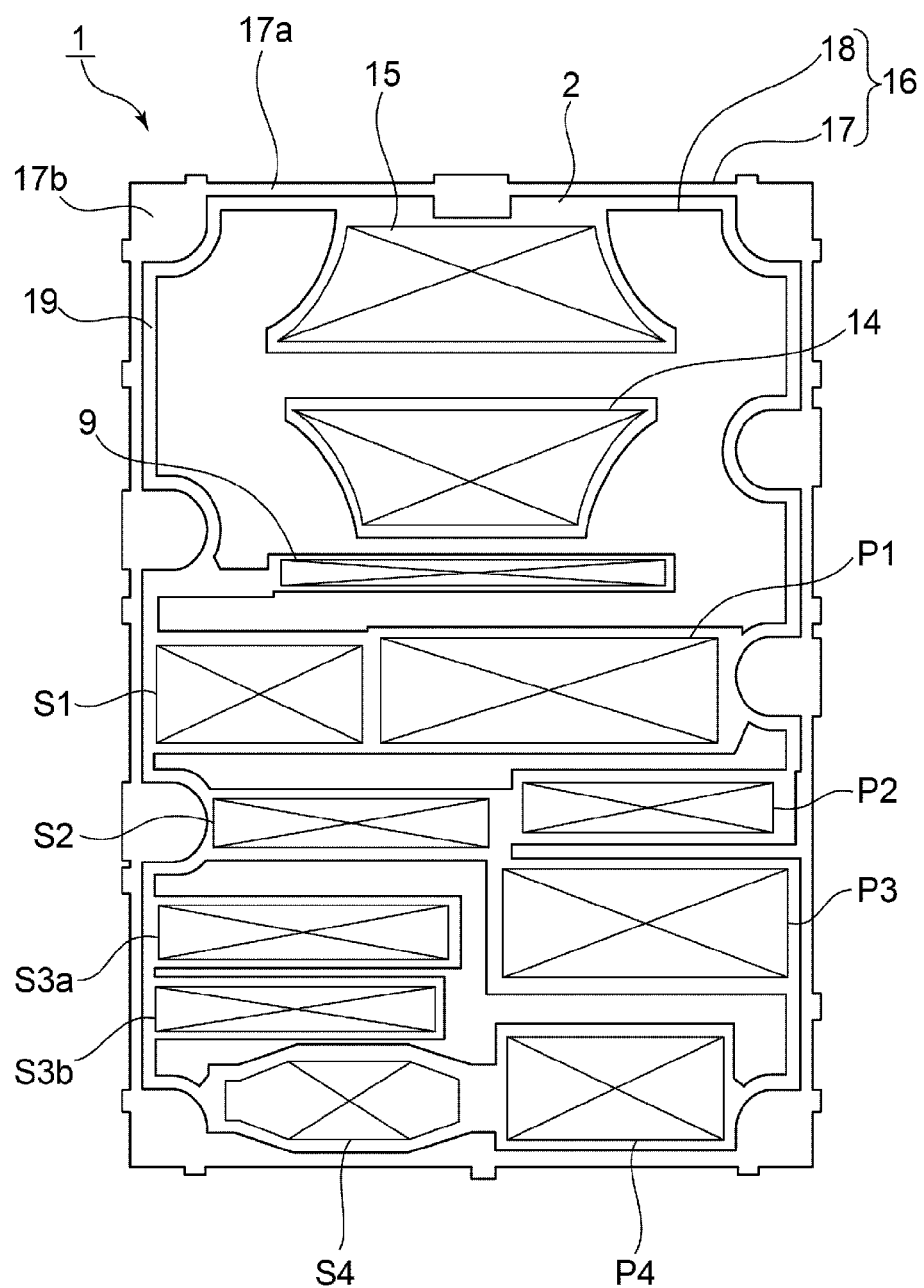
FIG. 1 is a schematic plan view illustrating the configuration of an elastic wave device according to a first preferred embodiment of the present invention in a state where a cover member is removed from the elastic wave device.
Figure 2:
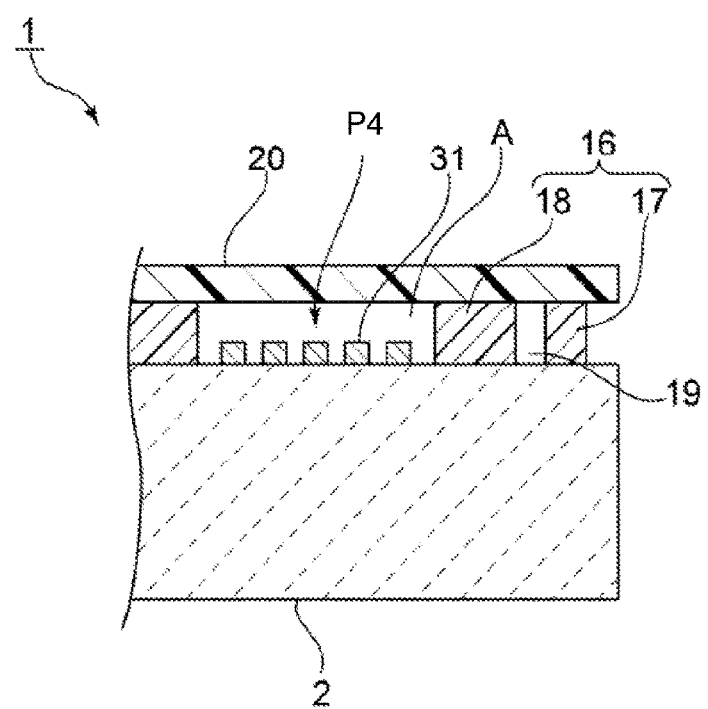
FIG. 2 is a partially cutaway sectional view illustrating a principal portion of the elastic wave device according to the first preferred embodiment of the present invention.

FIG. 1 is a schematic plan view illustrating the configuration of an elastic wave device according to a first preferred embodiment of the present invention in a state where a cover member is removed from the elastic wave device. FIG. 2 is a partially cutaway sectional view illustrating a principal portion of the elastic wave device according to the first preferred embodiment of the present invention, and FIG. 3A is a circuit diagram of the elastic wave device of the first preferred embodiment.

As illustrated in FIG. 1 and FIG. 2, an elastic wave device 1 includes a piezoelectric substrate 2. The piezoelectric substrate 2 is preferably a piezoelectric single-crystal substrate containing $LiTaO_3$ or $LiNbO_3$ or a piezoelectric ceramic plate. In the present preferred embodiment, the piezoelectric substrate 2 is preferably a piezoelectric single-crystal substrate that has the shape of a rectangular or substantially rectangular plate, for example.

In the present preferred embodiment, a duplexer includes a plurality of elastic wave elements on the piezoelectric substrate 2. More specifically, a duplexer that preferably has the circuit configuration illustrated in FIG. 3A is provided.

Figure 3A:
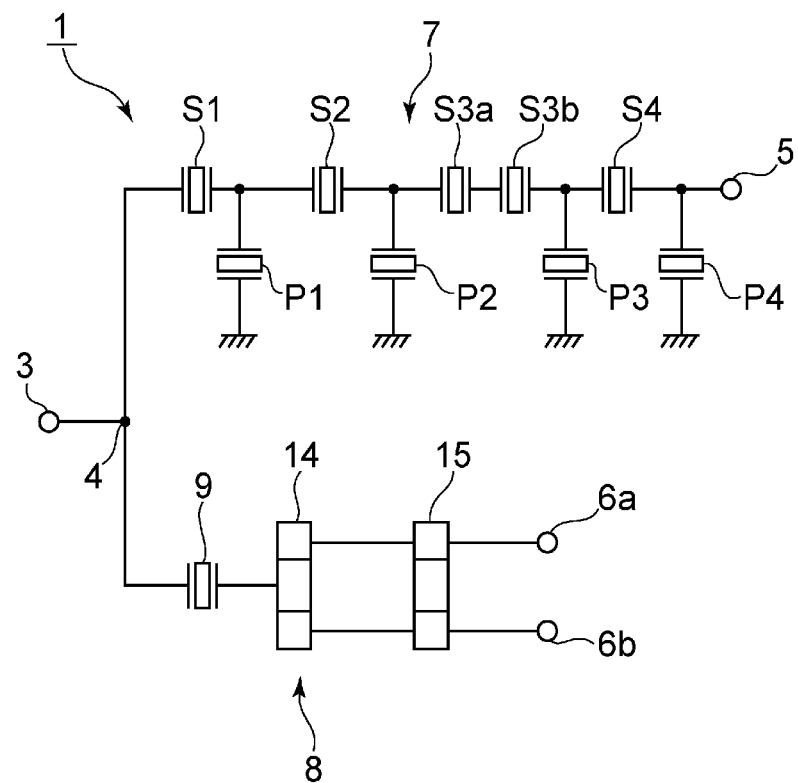
FIG. 3A is a diagram illustrating the circuit configuration of the elastic wave device of the first preferred embodiment.

As illustrated in FIG. 3A, the elastic wave device 1 includes an antenna terminal 3. A common terminal 4 is connected to the antenna terminal 3. A transmission filter 7 is provided between the common terminal 4 and a transmission terminal 5. A reception filter 8 is provided between the common terminal 4 and a pair of balanced terminals 6a and 6b.

The transmission filter 7 has a ladder circuit configuration. In other words, the transmission filter 7 includes serial arm resonators S1, S2, S3a, S3b, and S4 and parallel arm resonators P1 to P4 each of which includes an elastic wave resonator. Each of the serial arm resonators S1 to S4 and the parallel arm resonators P1 to P4 includes a one-port-type elastic wave resonator.

Figure 3B:
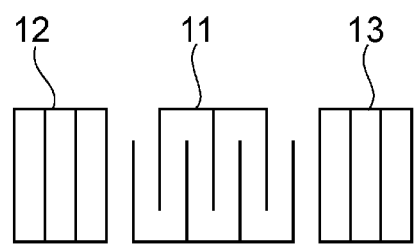
FIG. 3B is a plan view illustrating an example of the electrode structure of a one-port-type elastic wave resonator.

Each of the one-port-type elastic wave resonators preferably has the electrode structure illustrated in FIG. 3B. An IDT electrode 11 and reflectors 12 and 13 that are disposed at either side of the IDT electrode 11 in an elastic wave propagation direction are provided on the piezoelectric substrate 2. Each of the one-port-type elastic wave resonators is preferably configured in this manner.

Returning to FIG. 1, portions on the piezoelectric substrate 2 on which the serial arm resonators S1 to S4 and the parallel arm resonators P1 to P4 are located are each schematically indicated by an X symbol surrounded by a rectangular or substantially rectangular frame. In other words, each of the portions, on which the serial arm resonators S1 to S4 and the parallel arm resonators P1 to P4 are located, is one of the elastic wave elements.

Returning to FIG. 3A, in the reception filter 8, a one-port-type elastic wave resonator 9 that defines and functions as a trap filter is connected to the common terminal 4. Three-IDT longitudinally coupled resonator-type elastic wave filter portions 14 and 15 are disposed between the one-port-type elastic wave resonator 9 and the balanced terminals 6a and 6b. The longitudinally coupled resonator-type elastic wave filter portions 14 and 15 are connected to each other in a cascade connection. Note that, in the present preferred embodiment, the reception filter 8 preferably is a balanced filter that includes the pair of balanced terminals 6a and 6b. However, the reception filter may be an unbalanced-type filter. In each of the longitudinally coupled resonator-type elastic wave filter portions, in a propagation direction of a surface acoustic wave that propagates across a front surface of the piezoelectric substrate 2, a plurality of IDTs may be arranged side-by-side, and reflectors may be disposed at either side of a group of the plurality of IDTs. For example, as an example of a configuration in which a group of an odd number (three or greater) of IDTs are provided, each of the longitudinally coupled resonator-type elastic wave filter portions may include five IDTs.

Returning to FIG. 1, portions on the piezoelectric substrate 2 in which the one-port-type elastic wave resonator 9 and the longitudinally coupled resonator-type elastic wave filter portions 14 and 15 are provided are each schematically indicated by an X symbol surrounded by a frame. In the reception filter 8, each of the portions, on which the one-port-type elastic wave resonator 9 and the longitudinally coupled resonator-type elastic wave filter portions 14 and 15 are provided, is one of the elastic wave elements according to a preferred embodiment of the present invention.

Note that each of the IDT electrodes, the reflectors, and connection wiring lines in the above-described elastic wave elements can be made of a suitable metal, such as Ag, Cu, Pt, or W, or an alloy.

In the elastic wave device 1, spaces are preferably provided to not hinder vibrations of the elastic wave elements. The spaces are preferably sealed in order to reduce the degree of frequency variation and to improve humidity resistance.

In the present preferred embodiment, a support layer 16 extends around the elastic wave elements such that the above-described elastic wave elements are present in hollow portions. The support layer 16 includes a first support layer 17 and a second support layer 18.

The support layer 16 can be made of a suitable insulating material. A synthetic resin may preferably be used because a reduction in the weight and the manufacturing costs of the support layer 16 may be achieved by using a synthetic resin and because it is easier to manufacture the support layer 16 out of a synthetic resin. More preferably, a photosensitive resin is used because it is easy to perform patterning of the support layer 16. By using a photosensitive resin, the patterning of the support layer 16 can easily be performed by a photolithography method or the like. Consequently, the first and second support layers 17 and 18 and a hollow path 19, which will be described later, can be easily formed.

A suitable well-known photosensitive resin can be used as the above-mentioned photosensitive resin. Photosensitive polyimide, a photosensitive epoxy resin, photosensitive silicone resin, or the like can be used as such a photosensitive resin. It is further desirable that photosensitive polyimide be used because a photosensitive polyimide has appropriate rigidity and flexibility, and because the patterning of the support layer 16 can be performed with high precision by using photosensitive polyimide.

As illustrated in FIG. 1, the support layer 16 includes the first support layer 17 that extends along the outer peripheral edge of the piezoelectric substrate 2 and the second support layer 18 that is positioned in a region surrounded by the first support layer 17. The first support layer 17 and the second support layer 18 surround the elastic wave elements and defines the hollow portions, in which the elastic wave elements are present.

In addition, the hollow path 19 in which no support layer is present is located between the second support layer 18 and the first support layer 17. As a modification, the hollow path 19 may be formed by partially disposing a support layer that has a height smaller than the height of the second support layer 18 and smaller than the height of the first support layer in a direction normal to the front surface of the piezoelectric substrate 2.

FIG. 2 is a partially cutaway sectional view schematically illustrating the portion in which the parallel arm resonator P4 is provided. Here, the parallel arm resonator P4 is provided as one of the elastic wave elements. A hollow portion A is formed in such a manner that IDT electrode fingers 31 are present in the hollow portion A. In other words, the hollow portion A is defined by being surrounded by the first support layer 17, the second support layer 18, and a cover member 20. Near one of the side surfaces of the piezoelectric substrate 2, the first support layer 17 is located outside the second support layer 18 with the hollow path 19 interposed therebetween. The hollow path 19 enables communication between at least two of the hollow portions, in which the elastic wave elements are present.

The support layer 16 is divided into the first support layer 17 and the second support layer 18, and thus, the area of the first support layer 17 and the second support layer 18 is smaller than that of an undivided support layer.

Figure 5:
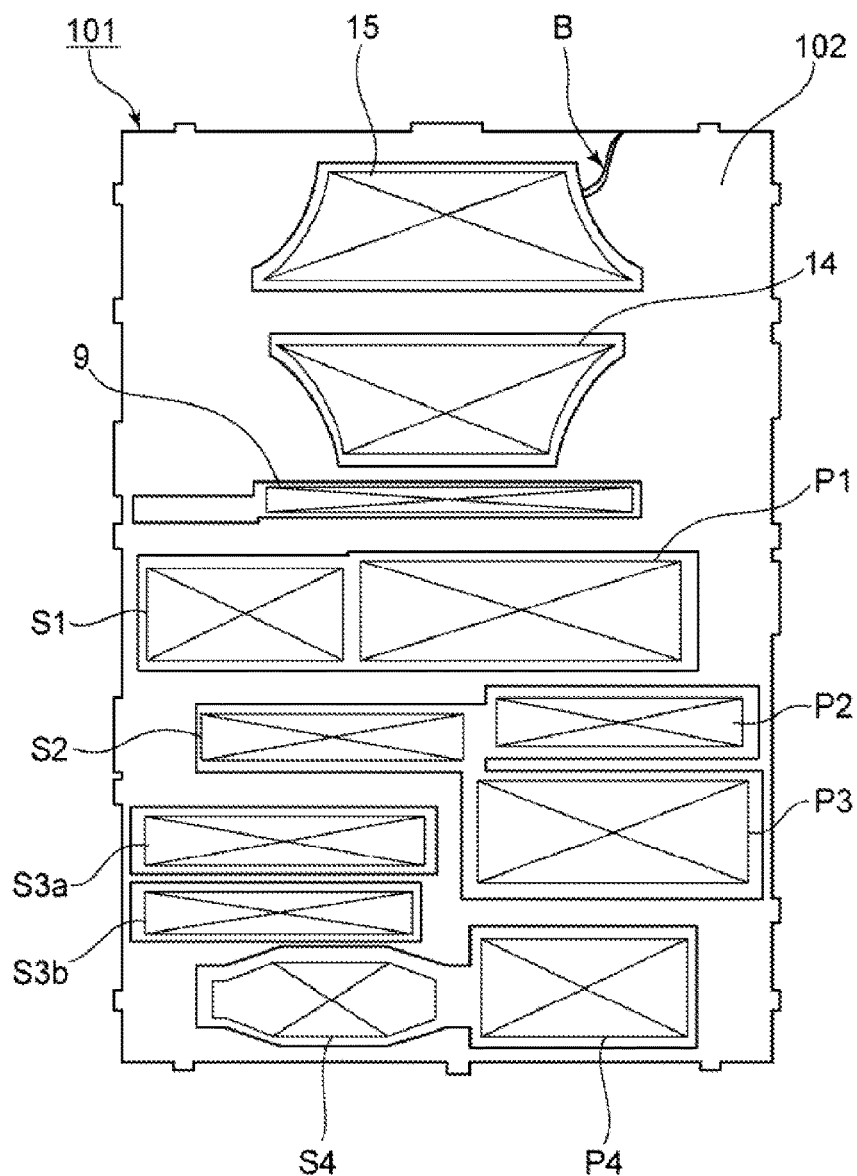
FIG. 5 is a schematic plan view illustrating the configuration of an elastic wave device according to a comparative example in a state where a cover member is removed from the elastic wave device.

This will be described in comparison with FIG. 5. FIG. 5 illustrates an elastic wave device 101 according to a comparative example that includes, instead of the above-described support layer 16, a support layer 102 in which the hollow path 19 is not provided. The elastic wave device 101 is configured in a similar manner to the elastic wave device 1 of the above-described preferred embodiment, except with regard to the support layer 102.

In the elastic wave device 101 of the comparative example illustrated in FIG. 5, the area of the support layer 102 is large.

In contrast, in the first preferred embodiment of the present invention, as illustrated in FIG. 1, the support layer is divided into the first support layer 17 and the second support layer 18. A rectangular and frame-shaped main body portion 17a of the first support layer 17 connects via-conductor-forming portions 17b. It is preferable that the width of the main body portion 17a of the first support layer 17 be about 50 μm or smaller, for example, in order to reduce the likelihood that air will enter an interface, and it is preferable that the width of the main body portion 17a be about 10 μm or larger, for example in order to ensure interface strength between the support layer 16 and the cover member 20. In the present preferred embodiment, the width of the main body portion 17a preferably is about 20 μm, for example. In other words, since the first support layer 17 and the second support layer 18 are divided by the hollow path 19, the area of the first support layer 17 and the area of the second support layer are smaller than the area of the support layer 102 of the elastic wave device 101 according to the comparative example. In addition, it is preferable that the width of the hollow path 19 be about 10 μm or larger and about 100 μm or smaller, for example.

Although the cover member is not illustrated in FIG. 1, in the elastic wave device 1, the cover member 20 is stacked on the support layer 16 to cover the entire top surface of the support layer 16, as illustrated in FIG. 2. The cover member 20 can be made of a suitable insulating material. It is preferable that the cover member 20 be made of a synthetic resin. In this case, simplification of a process of manufacturing the cover member 20 and a reduction in the manufacturing costs of the cover member 20 is achieved.

Such a synthetic resin is not particularly limited, and for example, an epoxy resin or a polyimide can be used. In the case where an epoxy resin is used, the epoxy resin can be cured at a temperature of, for example, about 170° C. to about 220° C. Thus, the cover member 20 is formed by a heat-curing treatment and joined to the support layer 16 through a curing process at a relatively low temperature.

The cover member 20, which is made of a synthetic resin such as those described above, is joined to the support layer 16 through a process in which the cover member 20, which is in the form of a sheet, is joined to the support layer 16 by, for example, rolling a roller from one side of the cover member 20 to the other side of the cover member 20 to cause the cover member 20 to be pressed into contact with the support layer 16. In this case, air may sometimes enter an interface between the cover member 20 and the support layer 16 resulting in generation of a void. However, in the present preferred embodiment, the support layer 16 is divided into the first support layer 17 and the second support layer 18, and thus, generation of a void is much less likely to occur or is prevented. Therefore, the probability of a leak defect of the hollow portions occurring due to such a void is effectively reduced or prevented.

In addition, after the elastic wave device 1 has been mounted on a module substrate, the elastic wave device 1 may sometimes be sealed with a mold resin by a transfer mold method. In this case, a large pressure is applied to the cover member 20 from the side on which the cover member 20 is present toward the side on which the piezoelectric substrate 2 is present and is also applied to a joint portion between the cover member 20 and the support layer 16. Thus, there is a possibility that portions of the cover member will become deformed toward the side on which the IDT electrodes are present in the above-described hollow portions and will interfere with the IDT electrodes. However, in the present preferred embodiment, the first support layer 17 and the second support layer 18 are provided, so that a tension that is exerted on the cover member 20 is generated as a result of deformation of the hollow path 19, and thus, deformation of the cover member 20 is much less likely to occur or is prevented. Therefore, the hollow portions each having a desired shape are liquid-tightly sealed with certainty, and more preferably, air-tightly sealed with certainty.

In the present preferred embodiment, as described above, the first support layer 17 preferably has a closed shape along the outer peripheral edge of the piezoelectric substrate 2. Accordingly, a dimension of the second support layer 18 between the inner wall and the outer wall of the second support layer 18 in the thickness direction of the second support layer 18 is relatively small. On the other hand, although the second support layer 18 is located inside the first support layer 17 with the hollow path 19 interposed therebetween, the area of the second support layer 18 is relatively large. The second support layer 18 preferably has an area smaller than the area of the support layer 102 of the elastic wave device 101 according to the comparative example illustrated in FIG. 5.

In the process in which the cover member 20 is joined to the support layer 16 by roller press bonding, a void is more likely to be generated as the area of a portion of the cover member 20 that is joined to the support layer 16 increases. Thus, in the elastic wave device 101 illustrated in FIG. 5, a void such as that indicated by arrow B may sometimes be generated so as to allow communication between one of the hollow portions and the outside. Consequently, a leak defect is likely to occur.

In contrast, in the elastic wave device 1 of the present preferred embodiment, even if a void, one end of which reaches one of the hollow portions, is generated in the second support layer 18, the other end of the void will not communicate with the outside air and will remain at a position in the hollow path 19. Thus, occurrence of a leak defect between the hollow portion and the outside is significantly reduced or prevented with certainty.

Although a support layer area of the second support layer 18 is large, and a void is likely to be generated, since the hollow path 19 is provided, a void generated in the support layer 18 will not be a problem.

As described above, in the elastic wave device 1 of the present preferred embodiment, occurrence of variations in frequency characteristics and deterioration of humidity resistance due to the leak defect are significantly reduced or prevented with certainty.

Figure 4:
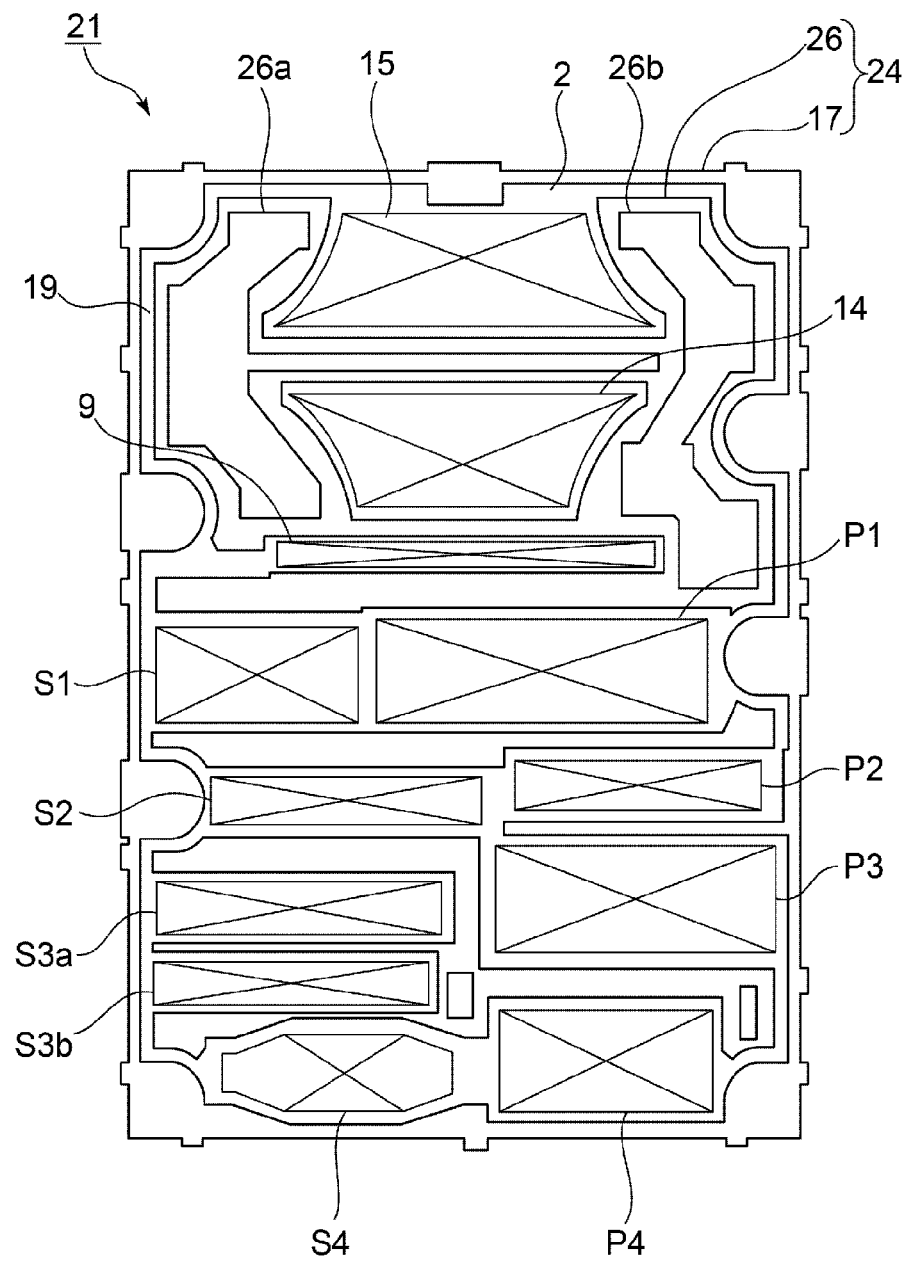
FIG. 4 is a schematic plan view illustrating the configuration of an elastic wave device according to a second preferred embodiment of the present invention in a state where a cover member is removed from the elastic wave device.

FIG. 4 is a schematic plan view illustrating an elastic wave device according to a second preferred embodiment of the present invention. The cover member is also not illustrated in FIG. 4. In other words, an elastic wave device 21 in a state where the cover member is removed therefrom is illustrated. In the elastic wave device 21, a support layer 24 includes the first support layer 17 and a second support layer 26. The elastic wave device 21 is configured in a similar manner to the elastic wave device 1, except with regard to the differences between the second support layer 26 and the second support layer 18. Therefore, components that are the same as the components according to the first preferred embodiment will be denoted by the same reference numerals, and the description of the first preferred embodiment will be incorporated herein.

In the elastic wave device 21, the second support layer 26 is made of a material the same as that of the first support layer 17 and includes a plurality of openings 26a and 26b. The openings 26a and 26b are located in the second support layer 26. Thus, the area of the second support layer 26 is smaller than that of the second support layer 18 of the first preferred embodiment.

Accordingly, in a process of stacking the cover member (FIG. 2) on the first and second support layers 17 and 26, a void is further less likely to be generated between the second support layer 26 and the cover member. In addition, even if a void that reaches one of the openings 26a and 26b is generated, that is, even if a void that extends to allow communication between an inner hollow portion and a second hollow portion, the void does not reach the outside. In other words, the elastic wave device 21 has a configuration in which a mass of air that has entered an interface between the support layer 26 and the cover member 20 is able to be discharged to the hollow path 19, which is positioned in the vicinity of the peripheral edge of the support layer 26, and thus, generation of a void is significantly reduced or prevented. Therefore, the leak defect is more effectively prevented from occurring.

As described above, in various preferred embodiments of the present invention, one or more openings may be suitably formed in the second support layer.

Note that, in the first and second preferred embodiments, the first support layer 17 preferably has a closed-loop shape along the outer peripheral edge of the piezoelectric substrate 2. In this way, it is desirable that the first support layer 17 have a closed-loop shape, and this further increases the airtightness of the elastic wave device. Also, the first support layer may be partially cut-away.

Although the one hollow path 19 enables communication between two or more of the hollow portions in the first preferred embodiment, the hollow path 19 is not particularly limited as long as the hollow path 19 is arranged to allow communication between at least two of the hollow portions.

In addition, a plurality of hollow paths may be provided.

Furthermore, the configurations of the plurality of elastic wave elements in the elastic wave device of the present invention are not limited to those according to the above-described preferred embodiments. In other words, the present invention can be applied to a suitable elastic wave device in which a plurality of elastic wave elements that include elastic wave resonators or elastic wave filters are provided on a piezoelectric substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
 a piezoelectric substrate;
 a plurality of elastic wave elements provided on the piezoelectric substrate and each of which includes at least one interdigital transducer (IDT) electrode;
 a support layer that is disposed outside regions in which the elastic wave elements are provided on the piezoelectric substrate to define hollow portions in portions in which the elastic wave elements are provided; and
 a cover member that seals the portions in which the elastic wave elements are provided, and that is stacked on the support layer to define the hollow portions; wherein
 the support layer includes:
  a first support layer that is disposed along an outer peripheral edge of the piezoelectric substrate; and
  a second support layer that is disposed in a region surrounded by the first support layer to substantially surround the portions in which the elastic wave elements are provided; wherein
 a hollow path is provided between the first support layer and the second support layer; and
 the hollow path enables communication between at least two of the hollow portions.

2. The elastic wave device according to claim 1, wherein an opening is provided in the second support layer that reduces a planar area of the second support layer.

3. The elastic wave device according to claim 1, wherein the first support layer has a closed-loop shape.

4. The elastic wave device according to claim 1, wherein the plurality of hollow portions are liquid-tightly sealed.

5. The elastic wave device according to claim 1, wherein, when seen in plan view, an outer peripheral edge of the cover member reaches the outer peripheral edge of the piezoelectric substrate, and a wafer-level package is provided.

6. The elastic wave device according to claim 1, wherein the plurality of elastic wave elements include serial arm resonators and parallel arm resonators on the piezoelectric substrate.

7. The elastic wave device according to claim 6, wherein a corresponding rectangular or substantially rectangular frame defined by the first and second support layers surrounds or substantially surrounds each of the plurality of elastic wave elements including the serial arm resonators and the parallel arm resonators.

8. The elastic wave device according to claim 1, wherein the support layer is made of a resin.

9. The elastic wave device according to claim 1, wherein the second support layer substantially surrounds the elastic wave elements and defines the hollow portions in which the elastic wave elements are present.

10. The elastic wave device according to claim 1, wherein the cover member is made of a resin.

11. The elastic wave device according to claim 1, wherein the plurality of hollow portions are air-tightly sealed.

12. The elastic wave device according to claim 1, wherein the first support layer and the second support layer are made of a same material.

13. The elastic wave device according to claim 1, wherein the second support layer includes a plurality of openings.

14. The elastic wave device according to claim 1, wherein a plurality of the hollow path is provided between the first support layer and the second support layer.

15. A duplexer comprising:
- a substrate; and
- a plurality of elastic wave devices on the substrate; wherein
- at least one of the plurality of elastic wave devices is the elastic wave device according to claim 1; and
- the substrate includes the piezoelectric substrate of the elastic wave device according to claim 1.

16. A duplexer comprising:
- a substrate; and
- a plurality of elastic wave devices on the substrate; wherein
- each of the plurality of elastic wave devices is the elastic wave device according to claim 1; and
- the substrate includes the piezoelectric substrate of the elastic wave device according to claim 1.

* * * * *